US012666761B2

(12) United States Patent
Kim et al.

(10) Patent No.: US 12,666,761 B2
(45) Date of Patent: Jun. 23, 2026

(54) LIGHT-EMITTING DEVICE AND DISPLAY INCLUDING THE SAME

(71) Applicant: SAMSUNG DISPLAY CO., LTD., Yongin-si (KR)

(72) Inventors: Sunil Kim, Suwon-si (KR); Junhee Choi, Suwon-si (KR); Nakhyun Kim, Suwon-si (KR); Junghun Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 362 days.

(21) Appl. No.: 18/223,323

(22) Filed: Jul. 18, 2023

(65) Prior Publication Data

US 2024/0243220 A1      Jul. 18, 2024

(30) Foreign Application Priority Data

Jan. 16, 2023      (KR) ......................... 10-2023-0006308

(51) Int. Cl.
H10H 20/81          (2025.01)
G02B 5/00          (2006.01)
(Continued)

(52) U.S. Cl.
CPC ......... H10H 20/8215 (2025.01); G02B 5/008 (2013.01); H10H 20/821 (2025.01); G09G 3/32 (2013.01)

(58) Field of Classification Search
CPC ............. H10H 20/8215; H10H 20/821; H10H 20/819; H10H 20/84; H10H 20/8512;

H10H 20/832; H10H 20/855; H10H 29/142; H10H 20/825; G02B 5/008; G02B 27/0101; G09G 3/32; H01L 25/0753

See application file for complete search history.

(56) References Cited

U.S. PATENT DOCUMENTS 11,127,917  B2      9/2021   Thompson et al.
2010/0181588  A1*    7/2010   Lee ........................ H10H 20/81
257/98

(Continued)

FOREIGN PATENT DOCUMENTS

KR          10-1619475  B1      5/2016

OTHER PUBLICATIONS

Koichi Okamoto et al., "Surface plasmon enhanced spontaneous emission rate of InGaN/GaN quantum wells probed by time-resolved photoluminescence spectroscopy", Applied Physics Letters, Aug. 15, 2005, vol. 87, No. 7, pp. 071102-1-071102-3 , DOI: 10.1063/1.2010602.

(Continued)

*Primary Examiner* — Mark W Tornow
(74) *Attorney, Agent, or Firm* — Sughrue Mion, PLLC

(57) ABSTRACT

A light-emitting device includes a first semiconductor layer having a first conductive type, an active layer provided on the first semiconductor layer, a second semiconductor layer provided on the active layer and having a second conductive type that is electrically opposite to the first conductive type, an insulating film at least partially surrounding the first semiconductor layer, the active layer, and the second semiconductor layer, and a first plurality of photo-conversion particles provided inside the first semiconductor layer.

18 Claims, 10 Drawing Sheets

(51) Int. Cl.
G09G 3/32 (2016.01)
H10H 20/821 (2025.01)

(56) References Cited

U.S. PATENT DOCUMENTS

| | | | |
|---|---|---|---|
| 2012/0153254 A1* | 6/2012 | Mastro ................. | H10H 20/862 |
| | | | 257/E33.007 |
| 2022/0059740 A1* | 2/2022 | Hahn ..................... | H01L 25/18 |
| 2022/0069005 A1 | 3/2022 | Do et al. | |
| 2024/0113264 A1 | 4/2024 | Choi et al. | |

OTHER PUBLICATIONS

J. B. Khurgin et al., "Electroluminescence efficiency enhancement using metal nanoparticles", Applied Physics Letters, Jul. 14, 2008, vol. 93, No. 2, pp. 021120-1-021120-3, DOI: doi.org/10.1063/1. 2957989.

Dong-Ming Yeh et al., "Localized surface plasmon-induced emission enhancement of a green light-emitting diode", Nanotechnology, 2008, vol. 19, No. 34, pp. 345201 (4 pages), DOI: 10.1088/0957-4484/19/34/345201.

Koichi Okamoto et al., "Surface-plasmon-enhanced light emitters based on InGaN quantum wells", Nature Materials, 2004, vol. 3, pp. 601-605, DOI: 10.1038/nmat1198.

* cited by examiner

LIGHT-EMITTING DEVICE AND DISPLAY INCLUDING THE SAME

CROSS-REFERENCE TO RELATED APPLICATIONS

This application is based on and claims priority under 35 U.S.C. § 119 to Korean Patent Application No. 10-2023-0006308, filed on Jan. 16, 2023, in the Korean Intellectual Property Office, the disclosure of which is incorporated by reference herein in its entirety.

BACKGROUND

1. Field

The disclosure relates to a light-emitting device and a display including the same.

2. Description of Related Art

A semiconductor light-emitting device, which is a high-efficiency and eco-friendly light source, has been used in various fields such as displays, optical communication, vehicles, general lighting, etc. The light-emitting device has an emission wavelength differing with a type and a composition of an active layer material. A color display uses three types of light-emitting devices that emit blue light, green light, and red light. Recently, the resolution of color displays has increased. To address this, the size of the light-emitting device needs to be reduced, which results in a rapid reduction of the efficiency of the light-emitting device.

SUMMARY

Provided are a light-emitting device having improved efficiency and a display including the light-emitting device.

Additional aspects will be set forth in part in the description which follows and, in part, will be apparent from the description, or may be learned by practice of the presented embodiments of the disclosure.

According to an aspect of the disclosure, a light-emitting device may include a first semiconductor layer having a first conductive type, an active layer provided on the first semiconductor layer, a second semiconductor layer provided on the active layer and having a second conductive type that is electrically opposite to the first conductive type, an insulating film at least partially surrounding the first semiconductor layer, the active layer, and the second semiconductor layer, and a first plurality of photo-conversion particles provided inside the first semiconductor layer.

The plurality of photo-conversion particles may be at a distance of at least about 30 nm from the active layer.

The device may include a second plurality of photo-conversion particles provided on the insulating film.

A diameter of at least one of photo-conversion particle of the first plurality of photo-conversion particles may be greater than or equal to about 1 nm and less than or equal to about 10 nm.

The first plurality of photo-conversion particles may be configured to amplify an intensity of incident light emitted from the active layer.

Each of the first plurality of photo-conversion particles may include at least one of gold (Au), silver (Ag), copper (Cu), and aluminum (Al).

The first plurality of photo-conversion particles may include different metals.

The first semiconductor layer may include an n-type semiconductor material and the second semiconductor layer may include a p-type semiconductor material.

The device may include a contact layer provided on a top surface of the second semiconductor layer.

The device may include a third plurality of photo-conversion particles provided on the contact layer.

The contact layer may include at least one of aluminum, titanium, indium, gold, silver, indium tin oxide (ITO), indium zinc oxide (IZO), and indium tin zinc oxide (ITZO).

The insulating film may have a thickness of about 30 nm or less.

The insulating film may include silicon oxide, silicon nitride, silicon oxynitride, aluminum nitride, aluminum oxide, hafnium oxide, yttrium oxide, or titanium dioxide.

According to an aspect of the disclosure, a display may include a display panel including a light-emitting structure including a plurality of light-emitting devices and a driving circuit configured to on-off switch the light-emitting structure, and a controller configured to, in response to receiving an image signal, input an on-off switching signal for the plurality of light-emitting devices to the driving circuit, where each light-emitting device of the plurality of light-emitting devices may include a first semiconductor layer having a first conductive type, an active layer provided on the first semiconductor layer, a second semiconductor layer provided on the active layer and having a second conductive type that is electrically opposite to the first conductive type, an insulating film at least partially surrounding the first semiconductor layer, the active layer, and the second semiconductor layer and a first plurality of photo-conversion particles provided inside the first semiconductor layer.

The first plurality of photo-conversion particles may be at a distance of at least 30 nm from the active layer.

The device may include a second plurality of photo-conversion particles provided on the insulating film.

A diameter of at least one photo-conversion particle of the first plurality of photo-conversion particles may be greater than or equal to about 1 nm and less than or equal to about 10 nm.

The first plurality of photo-conversion particles may be configured to amplify an intensity of incident light emitted from the active layer.

Each of the first plurality of photo-conversion particles may include at least one of gold (Au), silver (Ag), copper (Cu), and aluminum (Al).

The first plurality of photo-conversion particles may include different metals.

According to an aspect of the disclosure, a light-emitting device may include a first semiconductor layer having a first conductive type, an active layer provided on the first semiconductor layer, a second semiconductor layer provided on the active layer and having a second conductive type, an insulating film at least partially surrounding at least one of the first semiconductor layer, the second semiconductor layer and the active layer, and a plurality of photo-conversion particles including at least one first photo-conversion particle provided inside the first semiconductor layer and at least one second photo-conversion particle provided on the insulating film.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
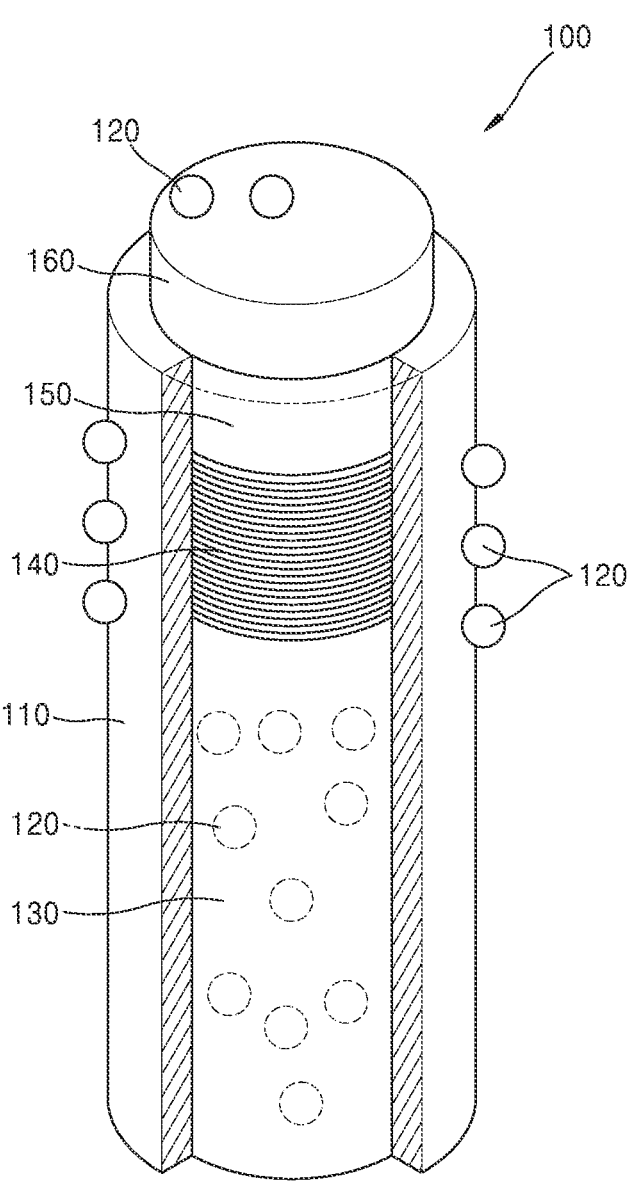
FIG. 1 is a diagram of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, with reference to the accompanying drawings, a light-emitting device and a display including the same will be described in detail. In the drawings, like reference numerals denote like components, and sizes of components in the drawings may be exaggerated for convenience of explanation. In addition, embodiments to be described are merely examples, and various modifications may be made from such embodiments.

An expression such as "above" or "on" may include not only the meaning of "immediately on in a contact manner", but also the meaning of "on in a non-contact manner". Singular forms include plural forms unless apparently indicated otherwise contextually. When a portion is referred to as "comprises" a component, the portion may not exclude another component but may further include another component unless stated otherwise.

The use of the terms of "the above-described" and similar indicative terms may correspond to both the singular forms and the plural forms. When there is an explicit description of the order of operations of the method or there is no description contrary thereto, these operations may be performed in an appropriate order and the order is not necessarily limited to the described order.

Connections of lines or connection members between components shown in the drawings are illustrative of functional connections and/or physical or circuit connections, and in practice, may be represented as alternative or additional various functional connections, physical connections, or circuit connections.

The use of all examples or exemplary terms is only to describe technical spirit in detail, and the scope is not limited by these examples or terms unless limited by the claims.

Figure 2:
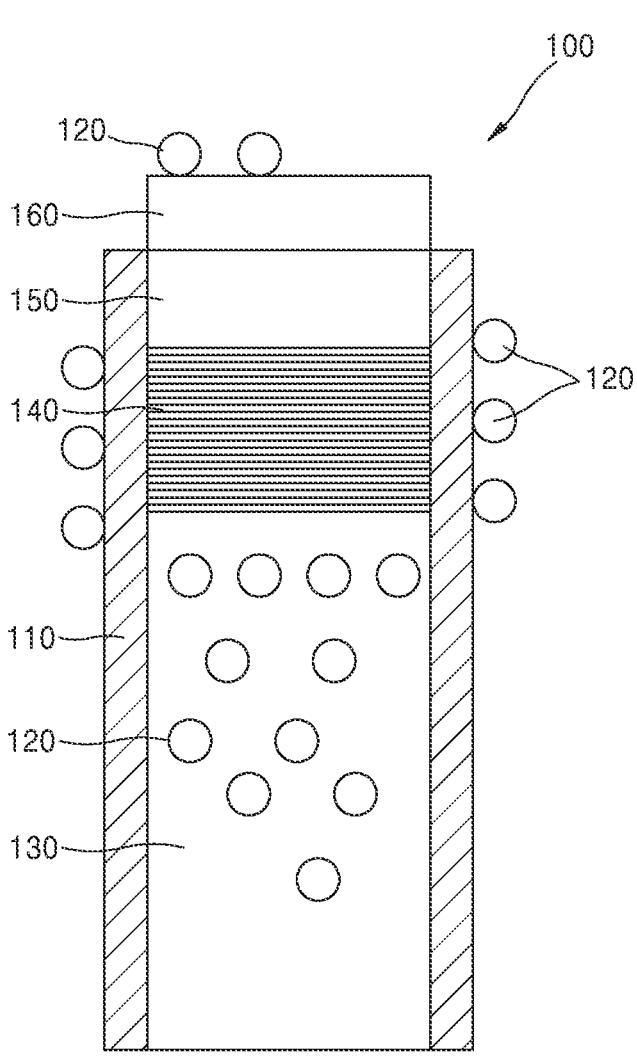
FIG. 2 is a cross-sectional view of a light-emitting device according to an embodiment.

FIG. 1 is a diagram of a light-emitting device according to an embodiment. FIG. 2 is a cross-sectional view of a light-emitting device according to an embodiment.

Referring to FIGS. 1 and 2, a light-emitting device 100 may include a first semiconductor layer 130 doped as a first conductive type (i.e., having a first conductive type), an active layer 140 arranged on the first semiconductor layer 130, a second semiconductor layer 150 arranged on the active layer 140 and doped as a second conductive type (i.e., having the second conductive type) that is electrically opposite to the first conductive type, an insulating film 110 arranged to surround, or at least partially surround sides or side surfaces of the first semiconductor layer 130, the active layer 140, and the second semiconductor layer 150, and at least one photo-conversion particle 120 arranged inside the first semiconductor layer 130. The light emitting device may include a plurality of photo-conversion particles 120, including at least one photo-conversion particle 120 inside the first semiconductor layer, at least one photo-conversion particle 120 provided on the insulator film 110, and at least one photo-conversion particle 120 provided on the contact layer 160, as is described in further detail below.

The light-emitting device 100 may have the shape of a nano rod, a nano wire, a nano tube, etc. In an embodiment, the light-emitting device 100 may have a cylindrical shape or a rod shape. However, the shape of the light-emitting device 100 is not limited thereto, and may be various such as a cube, a cuboid, a hexagonal prism, etc.

The light-emitting device 100 may emit light in a specific wavelength band. In an embodiment, light emitted from the active layer 140 may be red light with a central wavelength band ranging from about 620 nm to about 750 nm. However, the central wavelength band of the red light is not limited to the above-described range, and is to be understood as including the entire wavelength range perceived as red. The light emitting from the active layer 140 of the light-emitting device 100 is not limited thereto, and may be green light with a central wavelength band ranging from about 495 nm to about 570 nm or blue light with a central wavelength band ranging from about 450 nm to about 495 nm.

The first semiconductor layer 130 may be, for example, an n-type semiconductor of the first conductive type. The first semiconductor layer 130 may include at least one of InAl-GaN, GaN, AlGaN, InGaN, AlN, and InN, doped as an n-type. The first semiconductor layer 130 may be doped with a first conductive dopant. The first conductive dopant may be silicon (Si), germanium (Ge), tin (Sn), etc. For example, the first semiconductor layer 130 may be n-GaN doped with n-type Si.

The active layer 140 may include a material of a single or multi-quantum well structure. When the active layer 140 includes a material of a multi-quantum well structure, it may be structured such that a plurality of quantum wells and barriers are alternately stacked. The active layer 140 may emit light by combination of electron-hole pairs according to an electric signal applied through the first semiconductor layer 130 and the second semiconductor layer 150.

The second semiconductor layer 150 may be provided on the active layer 140. The second semiconductor layer 150 may be, for example, a p-type semiconductor of the second conductive type. The second semiconductor layer 150 may include at least one of InAlGaN, GaN, AlGaN, InGaN, AlN, and InN, doped as a p-type. The second semiconductor layer 150 may be doped with a second conductive dopant. The second conductive dopant may be magnesium (Mg), zinc (Zn), calcium (Ca), selenium (Se), barium (Ba), etc. For example, the second semiconductor layer 150 may be p-GaN doped with p-type Mg.

The light-emitting device 100 may further include an electron blocking layer arranged between the active layer 140 and the second semiconductor layer 150. The electron blocking layer may include AlGaN, AlInN, or AlInGaN. The electron blocking layer may have a thickness of about 3 nm or more. The electron blocking layer may prevent tunneling to efficiently block electrons.

The light-emitting device 100 may further include a contact layer 160. The contact layer 160 may be arranged on a top surface of the second semiconductor layer 150. The contact layer 160 may be an ohmic contact electrode. The contact layer 160 may include metal having conductivity. For example, the contact layer 160 may include at least one of aluminum (Al), titanium (Ti), indium (In), gold (Au), silver (Ag), indium tin oxide (ITO), indium zinc oxide (IZO), and indium tin-zinc oxide (ITZO). At least one photo-conversion particle 120 may be arranged on the contact layer 160 and may extract light out of the contact layer 160.

The insulating film 110 may be arranged to prevent current from flowing through sides (i.e., side surfaces) of the first semiconductor layer 130, the active layer 140, and the second semiconductor layer 150. The insulating film 110 may protect the first semiconductor layer 130, the active layer 140, and the second semiconductor layer 150. The insulating film 110 may have a ring shape surrounding or at least partially the sides (i.e., side surfaces) of the first semiconductor layer 130, the active layer 140, and the second semiconductor layer 150. The insulating film 110 may have a thickness of about 30 nm or less. The insulating film 110 may include materials having insulating properties, such as silicon oxide ($SiO_x$), silicon nitride ($SiN_x$), silicon oxynitride ($SiO_xN_y$), aluminum nitride (AlN), aluminum oxide ($AlO_x$), hafnium oxide ($HfO_2$), yttrium oxide ($Y_2O_3$), titanium dioxide ($TiO_2$), etc.

A plurality of photo-conversion particles 120 may be arranged inside the semiconductor layer 130. A pore may be formed inside the first semiconductor layer 130, and at least one photo-conversion particle 120 may be arranged in the pore formed in the first semiconductor layer 130. The at least one photo-conversion particle 120 arranged in the pore formed in the first semiconductor layer 130 may be arranged at a distance of about 30 nm or more from the active layer 140 inside the first semiconductor layer 130. As the at least one photo-conversion particle 120 arranged in the pore formed in the first semiconductor layer 130 is arranged at a distance from the active layer 140, the light efficiency of the light-emitting device 100 may be effectively improved by surface plasmon resonance.

At least one photo-conversion particle 120 may be provided on the insulating film 110. The at least one photo-conversion particle 120 may be provided on the insulating film 110 by attachment, adsorption, or combination. The at least one photo-conversion particle 120 may be attached on the insulating film 110 through a dipping process. Physical or chemical combination may occur between the at least one photo-conversion particle 120 and the insulating film 110. A plurality of photo-conversion particles may be provided inside the second semiconductor layer 150.

The plurality of photo-conversion particles 120 may amplify the intensity of incident light emitted from the active layer 140. The plurality of photo-conversion particles 120 may improve the light efficiency of the light-emitting device 100 through surface plasmon resonance.

The plurality of photo-conversion particles 120 may include different metals. The plurality of photo-conversion particles 120 may cause plasmon resonance in a wide area by including different metals. The plurality of photo-conversion particles 120 may include at least any one of Au, Ag, Cu, and Al. The plurality of photo-conversion particles 120 may have a diameter that may be greater than or equal to about 1 nm and less than or equal to about 10 nm. A shape of the plurality of photo-conversion particles 120 may be spherical or elliptical. While a spherical photo-conversion particle is shown in the drawing, the shape of the plurality of photo-conversion particles 120 may not be limited thereto.

Figure 3:
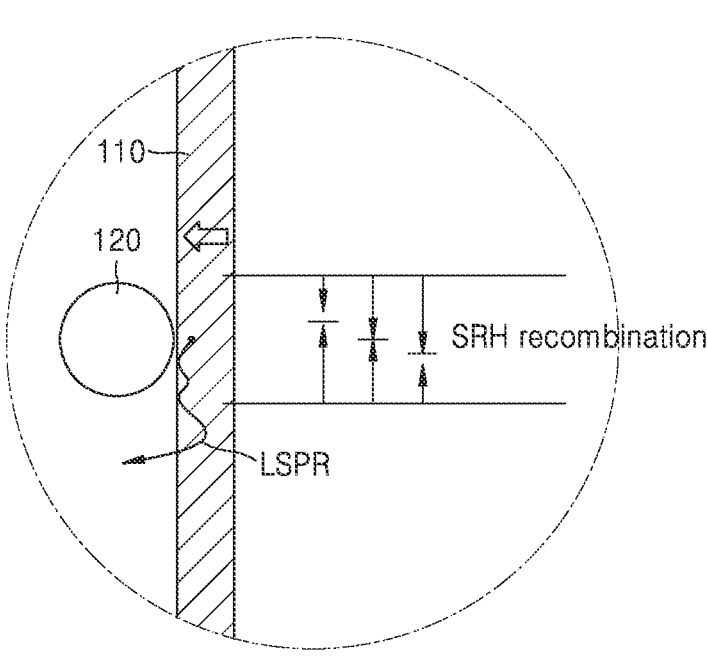
FIG. 3 is a diagram showing surface plasmon resonance in a light-emitting device according to an embodiment.

FIG. 3 is a diagram showing surface plasmon resonance in a light-emitting device according to an embodiment.

Referring to FIG. 3, localized surface plasmon resonance (LSPR) may occur between metal and a dielectric. Inside the light-emitting device, light may be lost without being extracted outside by Shockley-Read-Hall (SRH) recombination where electrons and holes are recombined via a trap. By using the plurality of photo-conversion particles 120, energy absorbed by SRH recombination may be delivered to the plurality of photo-conversion particles 120, causing LSPR. Surface plasmon is extracted as light to improve the light efficiency of a light-emitting device.

In the light-emitting device, the plurality of photo-conversion particles 120 inside the first semiconductor layer 130 causes LSPR, thereby improving light efficiency. A part of light generated in the active layer 140 travels into the first semiconductor layer 130, and LSPR may occur on an interfacial surface between the first semiconductor layer 130 and the plurality of photo-conversion particles 120 inside the first semiconductor layer 130.

In the light-emitting device, the plurality of photo-conversion particles 120 inside the first semiconductor layer 130 (as well as the photo-conversion particles 120 on the insulating film 110 and the photo-conversion particles 120 on the contact layer 160 in some embodiments) causes LSPR, thereby improving light efficiency. The light generated in the active layer 140 travels outside the light-emitting device, and LSPR may occur on an interfacial surface between the first semiconductor layer 130 and the plurality of photo-conversion particles 120.

Materials of the insulating film 110 and the plurality of photo-conversion particles 120 may be selected to increase the amount of light in a desired wavelength band. For example, when the insulating film 110 includes $Al_2O_3$ and the plurality of photo-conversion particles 120 includes silver, an increase in the amount of light by plasmon resonance may be maximum at a wavelength of about 630 nm.

Figure 4:
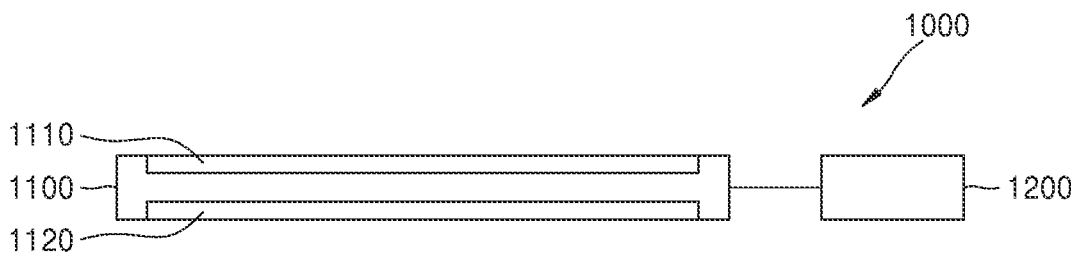
FIG. 4 is a diagram of a display according to an embodiment.

FIG. 4 is a diagram of an example of a display. Referring to FIG. 4, a display 1000 may include a display panel 1100 and a controller 1200. The display panel 1100 may include a light-emitting structure 1110 and a driving circuit 1120 that switches on and off the light-emitting structure 1110. The light-emitting structure 1110 may include the plurality of light-emitting devices 100 described above with reference to FIGS. 1 to 3. The plurality of light-emitting devices 100 may be arranged, for example, in the form of a two-dimensional (2D) array. The driving circuit 1120 may include a plurality of switching devices for separately switching on-off the plurality of light-emitting devices 100. The controller 1200 may input an on-off switching signal of the plurality of light-emitting devices 100 to the driving circuit 1120 according to an image signal.

Figure 5:
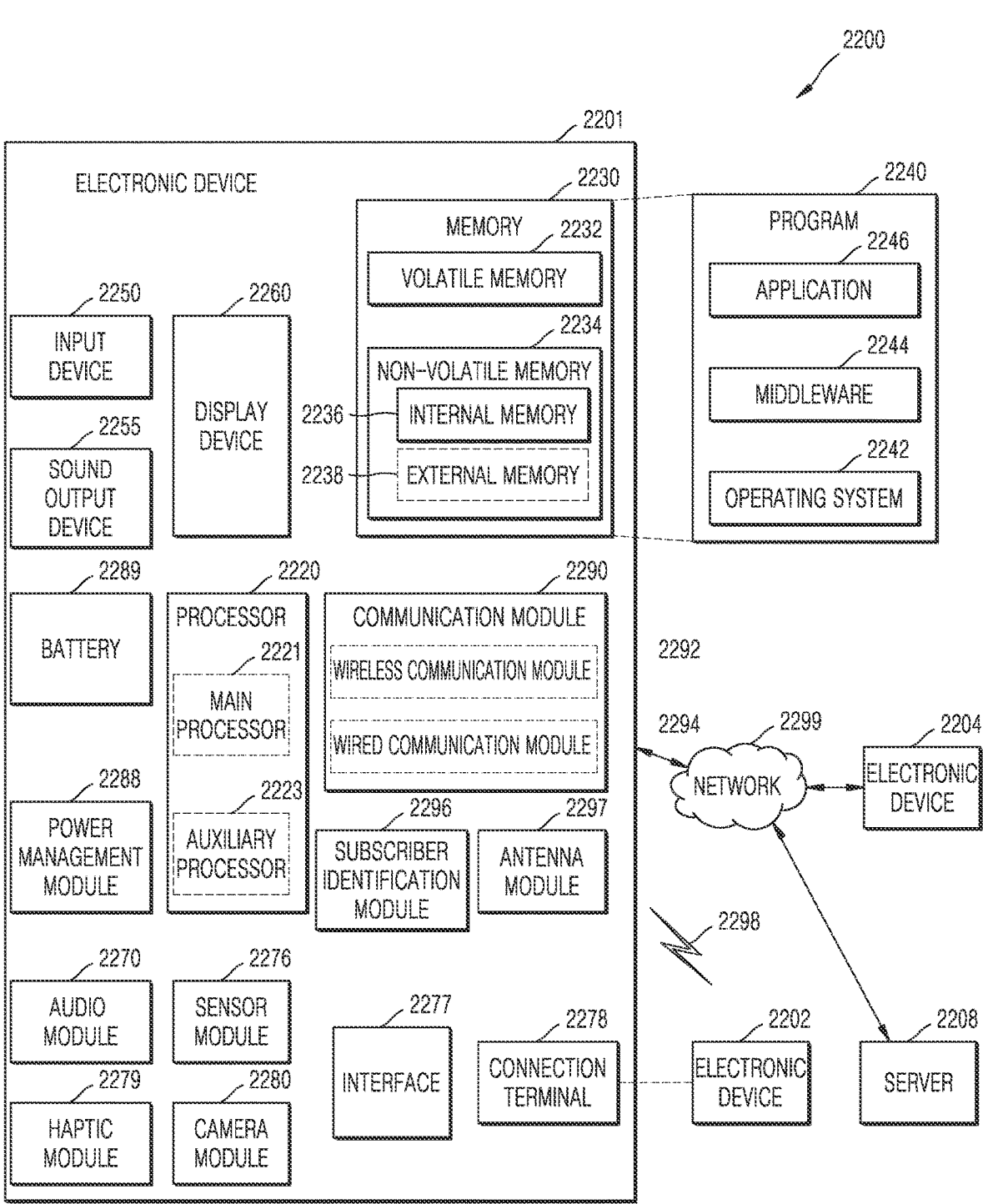
FIG. 5 is a diagram of an electronic device including a display according to an embodiment.

FIG. 5 is a diagram of an example of an electronic device including a display. Referring to FIG. 5, an electronic device 2201 may be provided in a network environment 2200. In the network environment 2200, the electronic device 2201 may communicate with another electronic device 2202 through a first network 2298 (a short-range wireless communication network, etc.) or communicate with another electronic device 2204 and/or a server 2208 through a second network 2299 (a long-range wireless communication network, etc.). The electronic device 2201 may communicate with the electronic device 2204 via the server 2208. The electronic device 2201 may include a processor 2220, a memory 2230, an input device 2250, a sound output device 2255, a display device 2260, an audio module 2270, a sensor module 2276, an interface 2277, a haptic module 2279, a camera module 2280, a power management module 2288, a battery 2289, a communication module 2290, a subscriber identification module 2296, and/or an antenna module 2297. In the electronic device 2201, some of the components may be omitted or another component may be added. Some of the components may be configured as one integrated circuit. For example, the sensor module 2276 (a fingerprint sensor, an iris sensor, an illuminance sensor, etc.) may be embedded and implemented in the display device 2260 (the display, etc.).

The processor 2220 may control one or more components (hardware, software components, etc.) of the electronic device 2201 connected to the processor 2220 by executing software (the program 2240, etc.), and may perform various data processes or operations. As a part of the data processes or operations, the processor 2220 may load a command and/or data received from another component (the sensor module 2276, the communication module 2290, etc.) to a volatile memory 2232, may process the command and/or data stored in the volatile memory 2232, and may store result data in a non-volatile memory 2234. The processor 2220 may include a main processor 2221 (a central processing unit, an application processor, etc.) and an auxiliary processor 2223 (a graphical processor unit (GPU), an image signal processor, a sensor hub processor, a communication processor, etc.) that may operate independently of or along with the main processor 2221. The auxiliary processor 2223 may use less power than that of the main processor 2221 and may perform specified functions.

The auxiliary processor 2223, on behalf of the main processor 2221 while the main processor 2221 is in an inactive state (a sleep state), or along with the main processor 2221 while the main processor 2221 is in an active state (an application executed state), may control functions and/or states related to some (the display device 2260, the sensor module 2276, the communication module 2290, etc.) of the components of the electronic device 2201. The auxiliary processor 2223 (the image signal processor, the communication processor, etc.) may be implemented as a part of another component (the camera module 2280, the communication module 2290, etc.) that is functionally related thereto.

The memory 2230 may store various data required by the components (the processor 2220, the sensor module 2276, etc.) of the electronic device 2201. The data may include, for example, software (the program 2240, etc.) and input data and/or output data about commands related thereto. The memory 2230 may include the volatile memory 2232 or the non-volatile memory 2234.

The program 2240 may be stored as software in the memory 2230, and may include an operating system 2242, middleware 2244, and/or an application 2246.

The input device 2250 may receive commands and/or data to be used in the components (the processor 2220, etc.) of the electronic device 2201, from the outside (a user, etc.) of the electronic device 2201. The input device 2250 may include a remote controller, a microphone, a mouse, a keyboard, and/or a digital pen (a stylus pen, etc.).

The sound output device 2255 may output a sound signal to the outside of the electronic device 2201. The sound output device 2255 may include a speaker and/or a receiver. The speaker may be used for a general purpose such as multimedia reproduction or record play, and the receiver may be used to receive a call. The receiver may be coupled as a part of the speaker or may be implemented as an independent separate device.

The display device 2260 may provide visual information to the outside of the electronic device 2201. The display device 2260 may include a display, a hologram device, or a projector, and a control circuit for controlling the corresponding device. The display device 2260 may include the display 1000 described with reference to FIG. 4. The display device 2260 may include the light-emitting device 100 described with reference to FIGS. 1 to 3. The display device 2260 may include a touch circuitry configured to sense a touch, and/or a sensor circuit (a pressure sensor, etc.) that is configured to measure a strength of a force generated by the touch.

The audio module 2270 may convert sound into an electrical signal or vice versa. The audio module 2270 may acquire sound through the input device 2250 or may output sound via the sound output device 2255 and/or a speaker and/or a headphone of another electronic device (the electronic device 2202, etc.) connected directly or wirelessly to the electronic device 2201.

The sensor module 2276 may sense an operating state (power, temperature, etc.) of the electronic device 2201, or an outer environmental state (a user state, etc.), and may generate an electrical signal and/or a data value corresponding to the sensed state. The sensor module 2276 may include a gesture sensor, a gyro sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface 2277 may support one or more designated protocols that may be used in order for the electronic device 2201 to be directly or wirelessly connected to another electronic device (the electronic device 2202, etc.). The interface 2277 may include a high-definition multimedia interface (HDMI), a universal serial bus (USB) interface, a secure digital (SD) card interface, and/or an audio interface.

The connection terminal 2278 may include a connector by which the electronic device 2201 may be physically connected to another electronic device (the electronic device 2202, etc.). The connection terminal 2278 may include an HDMI connector, a USB connector, an SD card connector, and/or an audio connector (a headphone connector, etc.).

The haptic module 2279 may convert the electrical signal into a mechanical stimulation (vibration, motion, etc.) or an electric stimulation that the user may sense through a tactile or motion sensation. The haptic module 2279 may include a motor, a piezoelectric device, and/or an electric stimulus device.

The camera module 2280 may capture a still image and a moving image. The camera module 2280 may include a lens assembly including one or more lenses, image sensors, image signal processors, and/or flashes. The lens assembly included in the camera module 2280 may collect light emitted from an object that is an object to be captured.

The power management module 2288 may manage power supplied to the electronic device 2201. The power management module 2288 may be implemented as a part of a power management integrated circuit (PMIC).

The battery 2289 may supply electric power to components of the electronic device 2201. The battery 2289 may include a primary battery that is not rechargeable, a secondary battery that is rechargeable, and/or a fuel cell.

The communication module 2290 may support establishment of a direct (wired) communication channel and/or a wireless communication channel between the electronic device 2201 and another electronic device (the electronic device 2202, the electronic device 2204, the server 2208, etc.), and execution of communication through the established communication channel. The communication module 2290 may operate independently of the processor 2220 (the application processor, etc.), and may include one or more communication processors that support the direct communication and/or the wireless communication. The communication module 2290 may include a wireless communication module 2292 (a cellular communication module, a short-range wireless communication module, a global navigation satellite system (GNSS) communication module) and/or a wired communication module 2294 (a local area network (LAN) communication module, a power line communication module, etc.). From among the communication modules, a corresponding communication module may communicate with another electronic device via a first network 2298 (a short-range communication network such as Bluetooth, Wireless Fidelity (WiFi) Direct, or Infrared Data Association (IrDA)) or a second network 2299 (a long-range communication network such as a cellular network, Internet, or a computer network (LAN, a wide area network (WAN), etc.)). Such various kinds of communication modules may be integrated as one component (a single chip, etc.) or may be implemented as a plurality of components (a plurality of chips) separately from one another. The wireless communication module 2292 may identify and authenticate the electronic device 2201 in a communication network such as the first network 2298 and/or the second network 2299 by using subscriber information (an international mobile subscriber identifier (IMSI), etc.) stored in the subscriber identification module 2296.

The antenna module 2297 may transmit or receive a signal and/or power to/from outside (another electronic device, etc.). An antenna may include a radiator formed as a conductive pattern formed on a substrate (a printed circuit board (PCB), etc.). The antenna module 2297 may include one or more antennas. When the antenna module 2297 includes a plurality of antennas, an antenna that is suitable for a communication scheme used in the communication network such as the first network 2298 and/or the second network 2299 may be selected by the communication module 2290 from among the plurality of antennas. The signal and/or the power may be transmitted between the communication module 2290 and another electronic device via the selected antenna. Another component (a radio frequency integrated circuit (RFIC), etc.) other than the antenna may be included as a part of the antenna module 2297.

Some of the components may be connected to one another via a communication scheme between peripheral devices (a bus, general purpose input and output (GPIO), a serial peripheral interface (SPI), a mobile industry processor interface (MIPI), etc.) and may exchange signals (commands, data, etc.).

The command or data may be transmitted or received between the electronic device 2201 and the external electronic device 2204 via the server 2208 connected to the second network 2299. Other electronic devices 2202 and 2204 may be devices of types that are the same as or different from the electronic device 2201. All or some of operations executed in the electronic device 2201 may be executed in one or more devices among the other electronic devices 2202, 2204, and 2208. For example, when the electronic device 2201 has to perform a certain function or service, the electronic device 2201 may request one or more other electronic devices to perform some or entire function or service, instead of executing the function or service by itself. One or more electronic devices receiving the request execute an additional function or service related to the request and may transfer a result of the execution to the electronic device 2201. For this end, cloud computing, distributed computing, and/or a client-server computing technique may be used.

The above-described electronic device 2201 may be applied to various devices. Various components of the above-described electronic device 2201 may be properly modified according to a function thereof, and components suitable for performing the function of the device) may be added. Hereinbelow, application examples of the electronic device 2201 will be described.

Figure 6:
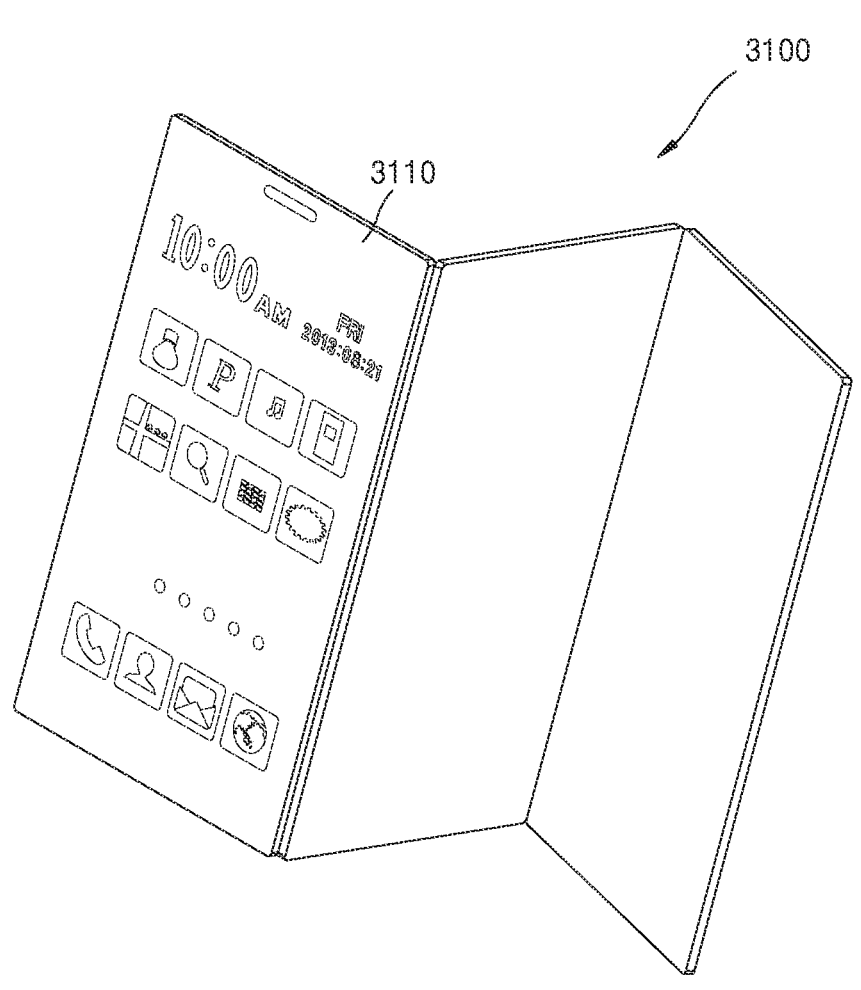
FIG. 6 is a diagram of a mobile device as an application example of an electronic device according to an embodiment.

FIG. 6 is a diagram of a mobile device as an application example of an electronic device according to an embodiment. A mobile device 3100 may include a display device 3110. The display device 3110 may include the display 1000 described with reference to FIG. 4. The display device 3110 may include the light-emitting device 100 described with reference to FIGS. 1 to 3. The display device 3110 may have a foldable structure, e.g., a multi-foldable structure.

Figure 7:
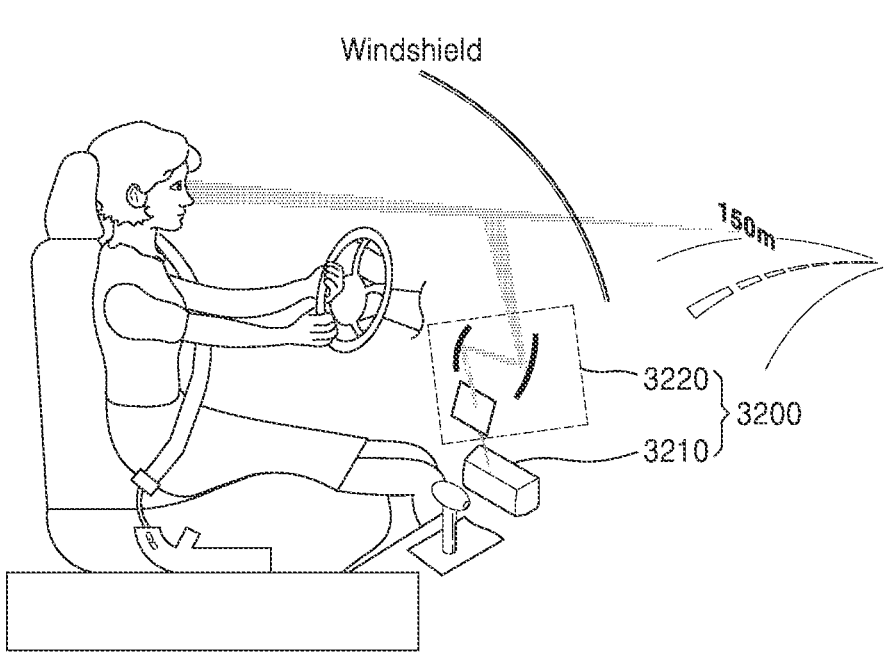
FIG. 7 is a diagram of a vehicle head-up display device as an application example of an electronic device according to an embodiment.

FIG. 7 is a diagram of a vehicle head-up display device as an application example of an electronic device according to an embodiment. A vehicle head-up display device 3200 may include a display 3210 provided in a region of a vehicle and an optical path change member 3220 for changing an optical path to allow a driver to see a generated image on the display 3210. The display 3210 may include the display 1000 described with reference to FIG. 4. The display 3210 may include the light-emitting device 100 described with reference to FIGS. 1 to 3.

Figure 8:
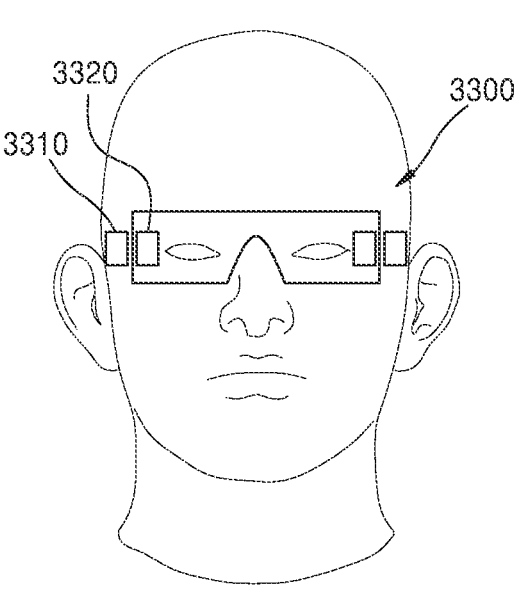
FIG. 8 is a diagram of augmented reality (AR) glasses or virtual reality (VR) glasses as an application example of an electronic device according to an embodiment.

FIG. 8 is a diagram of augmented reality (AR) glasses or virtual reality (VR) glasses as an application example of an electronic device according to an embodiment. AR glasses (or VR glasses) 3300 may include a projection system 3310 that forms an image and an element 3320 that guides an image from the projection system 3310 into an eye of a user. The projection system 3310 may include the display 1000 described with reference to FIG. 4. The projection system 3310 may include the light-emitting device 100 described with reference to FIGS. 1 to 3.

Figure 9:
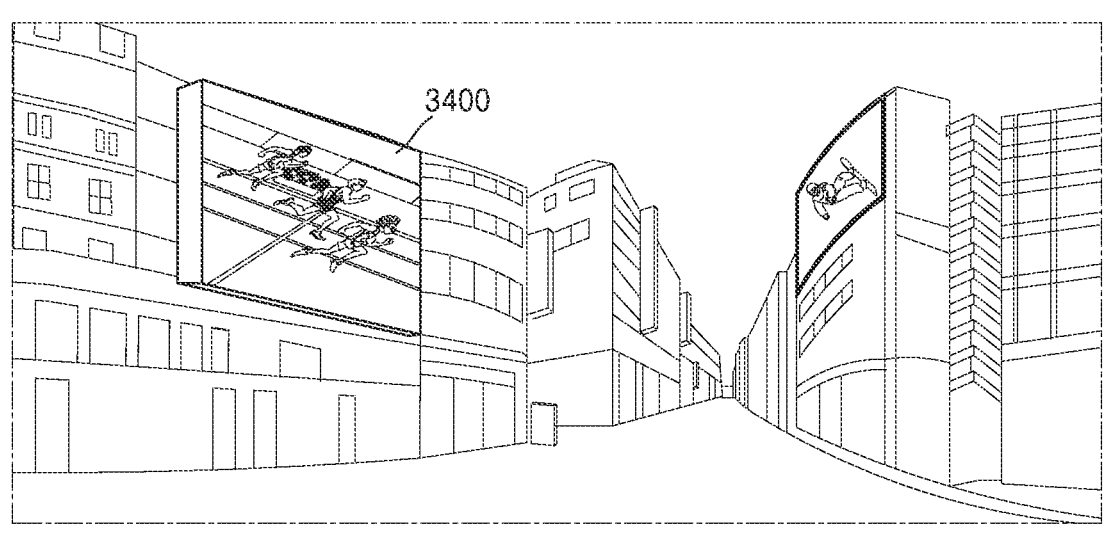
FIG. 9 is a diagram of a large signage as an application example of an electronic device according to an embodiment.

FIG. 9 is a diagram of a large signage as an application example of an electronic device according to an embodiment. A signage 3400 may include the display 1000 described with reference to FIG. 4. The signage 3400 may include the light-emitting device 100 described with reference to FIGS. 1 to 3. The signage 3400 may be used for outdoor advertising using a digital information display and may control advertising contents through a communication network. The signage 3400 may be implemented with, for example, the electronic device 2201 described with reference to FIG. 5.

Figure 10:
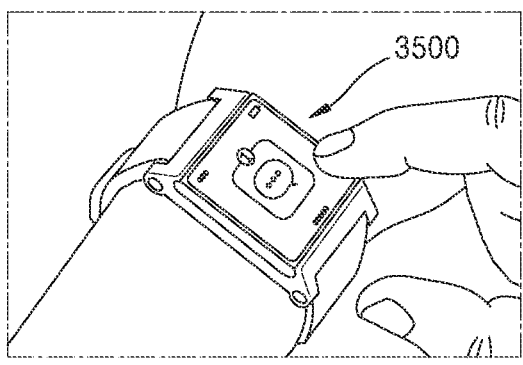
FIG. 10 is a diagram of a wearable display as an application example of an electronic device according to an embodiment.

FIG. 10 is a diagram of a wearable display as an application example of an electronic device according to an embodiment. A wearable display 3500 may include the display 1000 described with reference to FIG. 4. The wearable display 3500 may include the light-emitting device 100 described with reference to FIGS. 1 to 3 and may be implemented with the electronic device 2201 described with reference to FIG. 5.

The light-emitting device or the display including the same according to an embodiment may also be applied to various products such as a rollable television (TV), a stretchable display, etc.

According to embodiments based on the disclosure, the light-emitting device with an improved efficiency and the display including the same may be provided. While the above-described light-emitting device and the display including the same have been described with reference to the embodiments described in the drawings, it will be understood by those of ordinary skill in the art that various modifications and equivalent other embodiments are possible therefrom. Therefore, the disclosed embodiments should be considered in descriptive rather than restrictive. The scope of the present specification is not limited to that which is described above, but in the claims, and all the differences in a range equivalent thereto should be interpreted as being included.

The light-emitting device and the display including the same according to the disclosed embodiments may have an increased emission efficiency by including at least one photo-conversion particle inside a first semiconductor layer. The light-emitting device and the display including the same may also include at least one photo-conversion particle on an insulating film and on a contact layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first semiconductor layer having a first conductive type;
an active layer provided on the first semiconductor layer;
a second semiconductor layer provided on the active layer and having a second conductive type that is electrically opposite to the first conductive type;
an insulating film at least partially surrounding the first semiconductor layer, the active layer, and the second semiconductor layer;
a contact layer provided on a top surface of the second semiconductor layer; and
a plurality of photo-conversion particles comprising first photo-conversation particles provided inside the first semiconductor layer and third photo-conversion particles provided on the contact layer.

2. The light-emitting device of claim 1, wherein the first photo-conversion particles are at a distance of at least about 30 nm from the active layer.

3. The light-emitting device of claim 1, wherein the plurality of photo-conversion particles further comprises a second plurality of photo-conversion particles provided on the insulating film.

4. The light-emitting device of claim 1, wherein a diameter of at least one photo-conversion particle of the plurality of photo-conversion particles is greater than or equal to about 1 nm and less than or equal to about 10 nm.

5. The light-emitting device of claim 1, wherein the plurality of photo-conversion particles are configured to amplify an intensity of incident light emitted from the active layer.

6. The light-emitting device of claim 1, wherein each of the plurality of photo-conversion particles comprises at least one of gold (Au), silver (Ag), copper (Cu), and aluminum (Al).

7. The light-emitting device of claim 1, wherein the first plurality of photo-conversion particles comprise different metals.

8. The light-emitting device of claim 1, wherein the first semiconductor layer comprises an n-type semiconductor material, and
wherein the second semiconductor layer comprises a p-type semiconductor material.

9. The light-emitting device of claim 1, wherein the contact layer comprises at least one of aluminum, titanium, indium, gold, silver, indium tin oxide (ITO), indium zinc oxide (IZO), and indium tin zinc oxide (ITZO).

10. The light-emitting device of claim 1, wherein the insulating film has a thickness of about 30 nm or less.

11. The light-emitting device of claim 1, wherein the insulating film comprises silicon oxide, silicon nitride, silicon oxynitride, aluminum nitride, aluminum oxide, hafnium oxide, yttrium oxide, or titanium dioxide.

12. A display comprising:
a display panel comprising:
a light-emitting structure comprising a plurality of light-emitting devices; and
a driving circuit configured to on-off switch the light-emitting structure; and
a controller configured to, in response to receiving an image signal, input an on-off switching signal for the plurality of light-emitting devices to the driving circuit,
wherein each light-emitting device of the plurality of light-emitting devices comprises:
a first semiconductor layer having a first conductive type;
an active layer provided on the first semiconductor layer;
a second semiconductor layer provided on the active layer and having a second conductive type that is electrically opposite to the first conductive type;
an insulating film at least partially surrounding the first semiconductor layer, the active layer, and the second semiconductor layer;
a contact layer provided on a top surface of the second semiconductor layer; and
a plurality of photo-conversion particles comprising first photo-conversation particles provided inside the first semiconductor layer and third photo-conversion particles provided on the contact layer.

13. The display of claim 12, wherein the first photo-conversion particles are at a distance of at least 30 nm from the active layer.

14. The display of claim 12, wherein the plurality of photo-conversion particles further comprising a second plurality of photo-conversion particles provided on the insulating film.

15. The display of claim 12, wherein the plurality of photo-conversion particles are configured to amplify an intensity of incident light emitted from the active layer.

16. The display of claim 12, wherein each of the plurality of photo-conversion particles comprises at least one of gold (Au), silver (Ag), copper (Cu), and aluminum (Al).

17. The display of claim 12, wherein the plurality of photo-conversion particles comprise different metals.

18. A light-emitting device, comprising:
a first semiconductor layer having a first conductive type;
an active layer provided on the first semiconductor layer;
a second semiconductor layer provided on the active layer and having a second conductive type;
an insulating film at least partially surrounding at least one of the first semiconductor layer, the second semiconductor layer and the active layer;
a contact layer provided on a top surface of the second semiconductor layer; and
photo-conversion particles comprising at least one first photo-conversion particle provided inside the first semiconductor layer, at least one second photo-conversion particle provided on the insulating film and at least one third photo-conversion particle provided on the contact layer.

\* \* \* \* \*